RING COUNTER USING SEMICONDUCTOR SWITCHING DEVICES

Filed May 24, 1965

INVENTOR.
Richard S. Chamberlin
BY
Gordon H. Telfer
ATTORNEY

United States Patent Office 3,348,071

Patented Oct. 17, 1967

3,348,071
RING COUNTER USING SEMICONDUCTOR SWITCHING DEVICES

Richard S. Chamberlin, Baltimore, Md., assignor to Westinghouse Electric Corporation, Pittsburgh, Pa., a corporation of Pennsylvania Filed May 24, 1965, Ser. No. 458,239
5 Claims. (Cl. 307—88.5)

ABSTRACT OF THE DISCLOSURE

Ring counter apparatus is described comprising a plurality of four layer, three terminal semiconductor switching elements each having one terminal connected in common. Second terminals of each of the elements are serially connected together with at least one diode between each adjacent pair so that upon one element firing, the second terminals of the elements assume a staircase potential pattern that shifts upon the firing of successive elements so that a staircase waveform is exhibited at each of the second terminals.

This invention relates generally to electronic apparatus for providing a sequentially varying response to successively applied input signals and, more particularly, to ring counters of a plurality of semiconductor switching devices that may be conveniently disposed within a unitary body. Additionally, the invention relates to ring counters that function as staircase waveform generators useful, for example in digital computers and control circuits.

It is an object of the present invention to provide a ring counter whose elements may be disposed within a unitary body of semiconductive material.

Another object is to provide a ring counter that provides from each element a staircase waveform with a step in the staircase waveform being taken upon the application of each input pulse.

Another object is to provide a semiconductor ring counter with voltage coupling between stages so as to minimize the amount of necessary peripheral equipment.

Another object is to provide a semiconductor ring counter with improved noise immunity to prevent false triggering.

The invention, in summary, achieves the above mentioned and additional objects and advantages in the provision of ring counter apparatus comprising a plurality of four layer, three terminal semiconductor switching elements each having one terminal connected in common. Second terminals of each of the switching elements are serially connected together with at least one diode between each adjacent pair so that upon the firing of one switching element the potentials of each of the second terminals assumes a staircase pattern that shifts upon successive firing so that a staircase waveform is exhibited at each of the second terminals.

The invention, together with the above-mentioned and additional objects and advantages thereof will be better understood by reference to the following description taken with the accompanying drawing wherein.

For purposes of illustration, the invention will be described in embodiments of ten stages although it will be understood that other numbers of a plurality of stages may be employed in accordance with the present invention.

Figure 1:
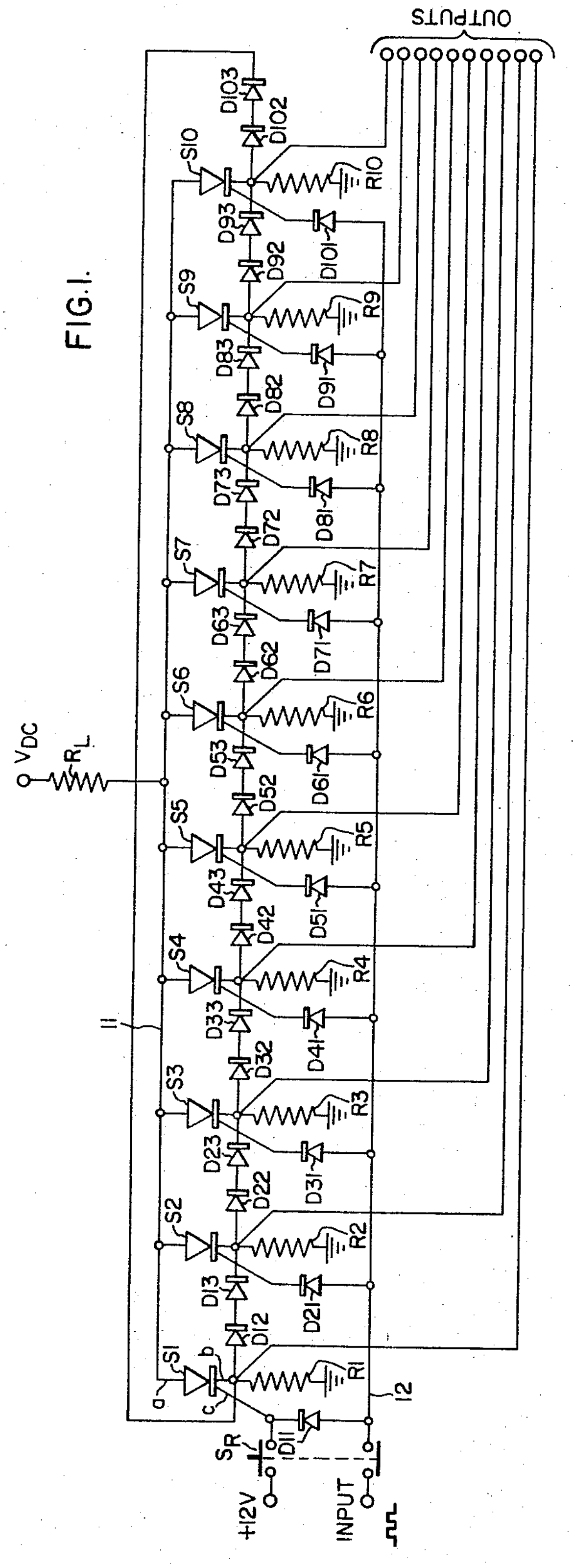
FIGURE 1 is a schematic diagram of one embodiment of the present invention.

Referring to FIG. 1, a plurality of switching means

S1 through S10 are illustrated and are interconnected in order to provide a ring counter in accordance with this invention. The switching means each have two terminals *a* and *b*, so indicated in the drawing for the first element S1 as an example. All of the switching means are substantially identical. Across their first and second terminals *a* and *b*, the switching means each exhibit a voltage-current characteristic current having a first stable state of high resistance and a second stable state of low resistance with a region of negative resistance therebetween.

In the illustrated embodiment each switching means also has a third terminal *c* that is provided for application of signals to effect switching between the high resistance and low resistance states. Such hyperconductive-negative resistance switches are well known as such and are sometimes referred to as four layer, three terminal switches as they generally comprise four layers of semiconductive material of alternating semi-conductivity type with terminals applied to the two external layers and one of the internal layers. They are also sometimes known as controlled rectifiers and as thyristors by which latter term they will be generally referred to herein.

The first terminals *a* of thyristors S1 through S10 are interconnected through conductor 11 and load resistor $R_L$ to a D.C. voltage supply that is of a polarity normally to forward bias the thyristors and, hence, in this example is of positive plurality.

Each third terminal *c* of all of the thyristors S1 through S10 is connected through an individual diode D11, D21, D31, D41, D51, D61, D71, D81, D91 and D101 to input terminal 12 to which input pulses are applied of a polarity in the forward direction of the just mentioned input diodes to effect sequential switching between the thyristors.

Each of the second terminals *b* of the thyristors S1 through S10 has four circuit members originating thereat. One is connected to ground through a resistor R1 through R10, one for each element. Another provides an output terminal for each of the elements and the two remaining provide coupling to the second terminals of adjacent thyristors on each side of the particular thyristor. All of the second terminals *b* are thus serially connected and they have between them asymmetrically conductive impedance means illustrated as diodes disposed in pairs although one or more diodes may be used as coupling elements between each stage. Diodes D12 and D13, diodes D22 and D23, diodes D32 and D33, diodes D42 and D43, diodes D52 and D53, diodes D62 and D63, diodes D72 and D73, diodes D82 and D83, diodes D92 and D93 and diodes D102 and D103 are, respectively, disposed between each adjacent pair of thyristors in the sequence from S1 through S10. A closed loop is formed as the diodes 102 and 103 connect the second terminal of thyristor S10 to the second terminal of thyristor S1.

Merely by way of example, means are provided to insure that the element that initially turns on, that is goes into the low resistance state, is S1. That is provided by depressing momentarily push-button switch $S_R$ which applies +12 volts D.C. to terminal *c* of S1 thereby turning S1 on. This action will remove the input trigger signal $E_{IN}$ from the common input line 12.

The operation of this embodiment of the invention proceeds as follows: $V_{DC}$ is applied of a magnitude that by itself is insufficient to cause the firing of any one of the thyristors in the absence of a pulse to the input terminal 12. With all of the thyristors "off," the reset switch $S_R$ is closed turning S1 on. The thyristors S2, S3, S4, S5, S6, S7, S8, S9, and S10 are inhibited from turning on due to the reverse bias across the second and third terminals of those elements. This bias is caused by the forward conductive diode path through D12 and D13, D22 and D23, etc. as well as the path through D11 and each of D21, D31, etc.

When thyristor S1 turns on the potential at its second terminal *b* assumes a value determined by the magnitude of $V_{DC}$, $R_L$ and R1, assuming that the thyristor S1 has negligible resistance in the "on" state. Merely for purposes of an example, assume that $V_{DC}$ is 53⅓ volts, $R_L$ is 5,000 ohms and R1 is 3,000 ohms. Then the potential appearing at terminal *b* and thyristor S1 is 20 volts.

Because of the serial interconnection of the second terminal of S1 with the second terminals of each of the other thyristors they assume potentials as determined by the impedance of the diodes 12, 13 etc. Assuming that each of the diodes has a forward voltage drop of ½ volt then the second terminal of S2 has a potential E2 of 19 volts, that of S3 has a potential E3 of 18 volts and so forth down to the second terminal of S10 having a potential of 11 volts.

The apparatus remains in this state with only S1 conducting until the arrival of a pulse of sufficient magnitude (say about +12 v.) to input terminal 12. Sequential operation will begin at the frequency of the applied input pulses. Upon application of the next pulse, thyristor S10 turns on because it has the lowest potential on its second terminal and hence is most favorably disposed to turn on assuming uniformity among the thyristors. When S10 turns on its second terminal assumes a potential of 20 volts, that of S1 assumes the potential of 19 volts and each thyristor to the right, except S10, has a potential successively one volt less than that of the next preceding element. S9 is then primed to be turned on upon the application of the second pulse.

The following table summarizes the potential appearing at the output terminals as operation progresses:

OUTPUT VOLTAGES (VOLTS)

| Thyristor | $S_R$ Closed | First Pulse After $S_R$ Opened | Second Pulse | Third Pulse | Tenth Pulse |
|---|---|---|---|---|---|
| S1 | [1] 20 | 19 | 18 | 17 | 20 |
| S2 | 19 | 18 | 17 | 16 | 19 |
| S3 | 18 | 17 | 16 | 15 | 18 |
| S4 | 17 | 16 | 15 | 14 | 17 |
| S5 | 16 | 15 | 14 | 13 | 16 |
| S6 | 15 | 14 | 13 | 12 | 15 |
| S7 | 14 | 13 | 12 | [2] 11 | 14 |
| S8 | 13 | 12 | [2] 11 | [1] 20 | 13 |
| S9 | 12 | [2] 11 | [1] 20 | 19 | 12 |
| S10 | [2] 11 | [1] 20 | 19 | 18 | [2] 11 |

[1] Indicates the "on" thyristor.
[2] Indicates the thyristor primed to be turned on by the next pulse.

Thus, on each of the output terminals a staircase waveform appears with, in this example, each succeeding step of the waveform being one volt less than the preceding one. After ten pulses or steps, the potential values return to those existing after initial firing. As indicated the firing sequence in this arrangement is S1, S10, S9, S8, S7, S6, S5, S4, S3, S2, S1, S10 etc.

The plurality of negative going staircase waveforms generated by apparatus in accordance with this invention is in contrast with that of conventional ring counters that provide a single pulse on each output line for each N successive pulses applied to the input, where N is the number of counter stages. Furthermore, in the present invention, voltage coupling between stages, through the coupling diodes D12, 13, 22, 23 etc., is used that eliminates the need for peripheral equipment such as gates, flip-flops or magnetic field sources that are sometimes required in other ring counters. Furthermore, the input coupling diodes and the interstage coupling diodes serve to provide noise immunity and prevent false triggering of adjacent stages since a known, predictable bias can be obtained across the coupling diodes. There are no problems resulting from diffusion of minorities carriers between elements such as false triggering effects.

Figure 2:
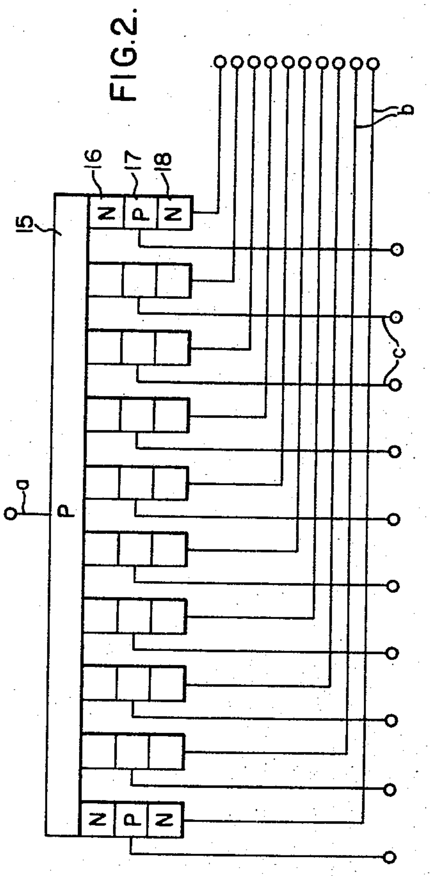
FIG. 2 is a cross sectional view of an integrated semiconductor structure suitable for use in accordance with the present invention.

A principal advantage of the present invention is that a substantial number of the elements may be incorporated within a unitary body of semiconductor material since only thyristors, diodes and resistors are required. In particular, it is convenient to provide all of the thyristors S1 through S10 within a unitary body as illustrated in FIG. 2. Here a semiconductor structure is shown of ten four layer elements of alternating semiconductivity type of which a first layer 15 is common to all of the elements while the layers 16, 17 and 18 are divided into separate portions within each element. This is merely by way of example however as it is not required that the layer 16 be fully divided.

A first terminal *a* is provided to the common region 15 corresponding to the terminal *a* of each of the thyristors S1 through S10 in FIG. 1. Second terminals *b* are provided to each of the other outer regions that are portions of layer 18 and correspond to the terminals *b* of the thyristors of FIG. 1. Third terminals *c* are connected to the adjacent inner region of portions of layer 17 and correspond to the terminals *c* of the thyristors of FIG. 1.

Following is a summary describing an example of a structure like that of FIG. 2 that is suitable. The starting material was of N type silicon having a resistivity between about 20 and 50 ohm-centimeters. The material was sliced, lapped, cut to size and etched. The dice were then loaded in a quartz tube with a gallium source. A vacuum was pulled on the tube and it was then sealed off. The tube was placed in a diffusion furnace for 40 hours with the silicon temperature at 1,083° C. and the gallium temperature at 600° C. The gallium diffused into the silicon to a depth of about 1 to 1.2 mils with a surface concentration of the order of $10^{18}$ atoms per cubic centimeter.

After diffusion, the dice were cleaned and then prepared for fusion. To one of the p diffused regions an ohmic contact of a gold-boron alloy was made providing the common contact to the region 15. To the other p layer 17 gold-antimony alloy foils were fused to form the portions of the layer 18, with a gold-boron alloy foil fused to each of the diffused layers 17 nearby for the terminal *c*. Diffused layer 17 was then separated, by etching, to form ten separate portions. The individual thyristor elements were thus essentially identical. They were employed in a circuit like that of FIG. 2 wherein R1 was 5,000, and R1 through R10 were 3,000 ohms. The diodes had a forward voltage drop of about ½ volt and were of commercially available 1N459 type. The D.C. voltage was +50 volts and the input pulses were about +12 volts.

It is to be understood that monolithic structures providing a plurality of thyristors, and possibly also coupling diodes, may be fabricated by techniques other than those described above. These techniques may include epitaxial growth techniques and selective diffusion of impurities through oxide masks.

While the present invention has been shown and described in a few forms only it will be apparent that various changes and modifications may be made without departing from the spirit and scope thereof.

What is claimed is:

1. A ring counter comprising: a plurality of switching elements each having first and second terminals connected across a source of D.C. potential, the current-voltage characteristic across said first and second terminals of each element exhibiting an "off" state of high resistance and an "on" state of low resistance with a transition region of negative resistance therebetween, each switching element also having a third terminal for the application of signals to effect switching between said off and on states; conductive means connecting each of said first terminals together; said second terminals being serially interconnected in a closed loop with at least one diode rectifier directly connected between each adjacent pair of said second terminals with all of said diode rectifiers being poled in the same direction; said third terminals each being connected through a respective impedance means to a source of input signals; means to place a first switching element in said "on" state so that the second terminal of said first switching element assumes a first potential and the second terminal of each succeeding switching element assumes a potential less than that of the second terminal of the preceding switching element by the forward voltage drop of said at least one diode rectifier connected therebetween; means to apply input signals to said third terminals to sequentially turn "on" said switching elements and produce a staircase waveform at each of said second terminals.

2. A ring counter as defined by claim 1 wherein: each of said switching elements is a semiconductor device.

3. A ring counter as defined by claim 2 wherein: said semiconductor device is a thyristor.

4. A ring counter as defined by claim 1 wherein: each said impedance means is an additional diode rectifier.

5. A ring counter as defined by claim 2 wherein: all of said semiconductor device switching elements are contained within a unitary body of material.

References Cited

UNITED STATES PATENTS

| | | | |
|---|---|---|---|
| 2,426,278 | 8/1947 | Mumma | 315—84.5 |
| 3,049,642 | 8/1962 | Quinn | 307—88.5 |
| 3,260,858 | 7/1966 | Kueber | 307—88.5 |

ARTHUR GAUSS, *Primary Examiner.*

J. ZAZWORSKY, *Assistant Examiner.*